United States Patent

Tokuda et al.

(10) Patent No.: US 11,846,040 B2
(45) Date of Patent: Dec. 19, 2023

(54) SILICON CARBIDE SINGLE CRYSTAL

(71) Applicants: DENSO CORPORATION, Kariya (JP); CENTRAL RESEARCH INSTITUTE OF ELECTRIC POWER INDUSTRY, Tokyo (JP)

(72) Inventors: Yuichiro Tokuda, Kariya (JP); Hideyuki Uehigashi, Kariya (JP); Norihiro Hoshino, Yokosuka (JP); Hidekazu Tsuchida, Yokosuka (JP); Isaho Kamata, Yokosuka (JP)

(73) Assignees: DENSO CORPORATION, Kariya (JP); CENTRAL RESEARCH INSTITUTE OF ELECTRIC POWER INDUSTRY, Tokyo (JP)

( * ) Notice: Subject to any disclaimer, the term of this patent is extended or adjusted under 35 U.S.C. 154(b) by 556 days.

(21) Appl. No.: 17/123,338

(22) Filed: Dec. 16, 2020

(65) Prior Publication Data

US 2021/0102311 A1 Apr. 8, 2021

Related U.S. Application Data

(63) Continuation of application No. PCT/JP2019/023877, filed on Jun. 17, 2019.

(30) Foreign Application Priority Data

Jun. 19, 2018 (JP) .................. 2018-116384

(51) Int. Cl.
*C30B 29/36* (2006.01)
*C30B 25/20* (2006.01)
*C01B 32/956* (2017.01)

(52) U.S. Cl.
CPC .............. *C30B 29/36* (2013.01); *C30B 25/20* (2013.01); *C01B 32/956* (2017.08)

(58) Field of Classification Search
CPC ............................. C30B 29/36; C01B 32/956
See application file for complete search history.

(56) References Cited

U.S. PATENT DOCUMENTS

| | | | |
|---|---|---|---|
| 6,261,363 B1 * | 7/2001 | Vodakov | C30B 23/00 117/106 |
| 2002/0104478 A1 | 8/2002 | Oguri et al. | |
| 2006/0118037 A1 | 6/2006 | Powell et al. | |
| 2012/0308758 A1 | 12/2012 | Hori et al. | |
| 2013/0153836 A1 * | 6/2013 | Miyamoto | C30B 29/36 252/516 |
| 2018/0012758 A1 * | 1/2018 | Tsuchida | H01L 29/1608 |

FOREIGN PATENT DOCUMENTS

| | | | |
|---|---|---|---|
| JP | 2006-124247 | * | 5/2006 |
| JP | 2006-124247 A | | 5/2006 |
| JP | 2013-173655 A | | 9/2013 |
| JP | 2016-098120 A | | 5/2016 |

* cited by examiner

*Primary Examiner* — C Melissa Koslow

(74) *Attorney, Agent, or Firm* — POSZ LAW GROUP, PLC

(57) ABSTRACT

A silicon carbide single crystal contains a heavy metal element having a specific gravity higher than a specific gravity of iron. An addition density of the heavy metal element at least in an outer peripheral portion of the silicon carbide single crystal is set to $1 \times 10^{15}$ cm$^{-3}$ or more.

12 Claims, 2 Drawing Sheets

SILICON CARBIDE SINGLE CRYSTAL

CROSS REFERENCE TO RELATED APPLICATIONS

The present application is a continuation application of International Patent Application No. PCT/JP2019/023877 filed on Jun. 17, 2019, which designated the U.S. and claims the benefit of priority from Japanese Patent Application No. 2018-116384 filed on Jun. 19, 2018. The entire disclosures of all of the above applications are incorporated herein by reference.

TECHNICAL FIELD

The present disclosure relates to a silicon carbide (hereinafter referred to as SiC) single crystal.

BACKGROUND

Conventionally, a crystal growth of an SiC single crystal is performed by a bulk crystal growth method in which an SiC raw material gas is supplied onto a growth surface of a seed crystal made of an SiC single crystal and the SiC single crystal is grown in a bulk shape on the seed crystal.

SUMMARY

The present disclosure provides a silicon carbide single crystal containing a heavy metal element having a specific gravity higher than a specific gravity of iron, and an addition density of the heavy metal element at least in an outer peripheral portion of the silicon carbide single crystal is set to $1\times10^{15}$ cm$^{-3}$ or more.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
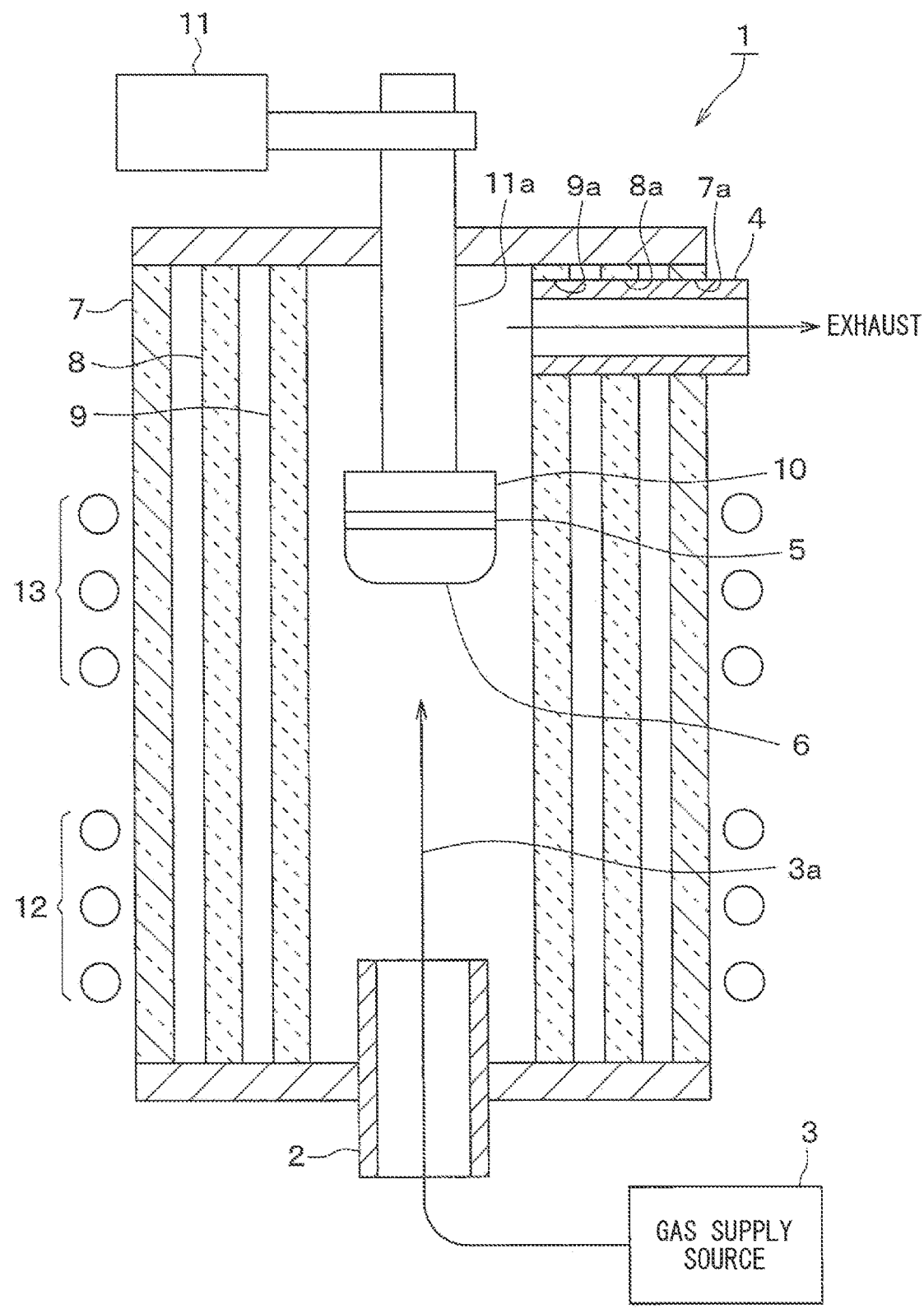
FIG. 1 is a cross-sectional view of an SiC single crystal manufacturing apparatus according to a first embodiment.

In a bulk crystal growth method, since an SiC single crystal is manufactured in an environment where there is a temperature distribution in a reaction vessel in which the SiC single crystal is grown, thermal stress due to the temperature distribution may be generated, and dislocations, which are crystal defects, may occur and propagate.

In order to restrict unnecessary thermal stress from being generated in the SiC single crystal, a seed crystal holder serving as a pedestal for holding a seed crystal may be annealed in advance to suppress a shape change of the seed crystal holder and to minimize stress acting on the seed crystal.

However, even if the shape change of the seed crystal holder can be suppressed by annealing, it is difficult to completely remove the stress acting on the SiC single crystal as long as a material of the seed crystal holder is different from SiC. Further, in order to grow an SiC single crystal, it is necessary that a temperature distribution is generated in the SiC single crystal, and stress is also generated by the temperature distribution in the SiC single crystal.

Therefore, dislocations having a certain density may occur or propagate in the SiC single crystal. Further, when the SiC single crystal obtained by growth is sliced into a disk-shaped wafer, warpage may occur due to residual stress. Further, when an SiC crystal growth is carried out on the obtained wafer by epitaxial growth, the SiC crystal growth is carried out at a temperature exceeding 1000° C., and dislocations and propagation may occur also in a temperature raising process.

In an SiC single crystal according to one aspect of the present disclosure, a heavy metal element having a specific gravity higher than a specific gravity of iron is added at least in an outer peripheral portion, and the addition density of the heavy metal element is $1\times10^{15}$ cm$^{-3}$ or more.

The SiC single crystal having the addition density of the heavy metal element of $1\times10^{15}$ cm$^{-3}$ or more is less likely to cause dislocations due to thermal stress generated during the growth of the SiC single crystal. Therefore, even when the SiC single crystal is sliced into a wafer and an SiC layer is epitaxially grown on the wafer, dislocations are less likely to occur. With such a configuration, it is possible to obtain the SiC single crystal capable of suppressing the generation and propagation of dislocations.

The following describes one or more embodiments of the present disclosure with reference to the drawings. In the following embodiments, the same or equivalent parts are denoted by the same reference numerals for description.

First Embodiment

First, an SiC single crystal manufacturing apparatus used for manufacturing an SiC single crystal according to a first embodiment will be described.

An SiC single crystal manufacturing apparatus 1 shown in FIG. 1 is used for manufacturing an SiC single crystal ingot by long growth, and is installed so that a vertical direction of a paper plane of FIG. 1 corresponds to a vertical direction.

Specifically, the SiC single crystal manufacturing apparatus 1 causes a supply gas 3a including an SiC raw material gas from a gas supply source 3 to flow in through a gas supply port 2, and causes an unreacted gas to be exhausted through a gas exhaust port 4, thereby growing an SiC single crystal 6 on a seed crystal 5 formed of an SiC single crystal substrate.

The SiC single crystal manufacturing apparatus 1 includes the gas supply source 3, a vacuum container 7, a heat insulating member 8, a heating vessel 9, a pedestal 10, a rotary pulling mechanism 11, and first and second heating devices 12 and 13.

The gas supply source 3 supplies the SiC raw material gas containing Si and C together with a carrier gas, for example, a mixed gas of a silane-based gas such as silane and a hydrocarbon-based gas such as propane, from the gas supply port 2. The gas supply source 3 and the like configure a gas supply mechanism for supplying the SiC raw material gas to the seed crystal 5 from below.

Further, in the present embodiment, a gas containing atoms of a heavy metal having a specific gravity higher than a specific gravity of Fe (iron) is supplied from the gas supply source 3 in addition to the SiC raw material gas. Examples of the heavy metal having the specific gravity higher than the specific gravity of Fe include Nb (niobium), Ta (tantalum), Mo (molybdenum), W (tungsten), Ir (iridium) and the like.

The vacuum container 7 is made of quartz glass or the like, has a tube shape providing a hollow portion, in the present embodiment, a cylindrical shape, and is configured so that the supply gas 3a can be introduced and exhausted. The vacuum container 7 accommodates other components of the SiC single crystal manufacturing apparatus 1, and is configured to be able to reduce a pressure by vacuum drawing in an accommodated internal space. The gas supply port 2 of the supply gas 3a is provided at a bottom of the vacuum container 7, a through hole 7a is provided at a top, specifically, at a position above a side wall of the vacuum container 7, and the gas exhaust port 4 of an exhaust gas such as an unreacted gas of the supply gas 3a is fitted into the through hole 7a.

The heat insulating member 8 has a tube shape providing a hollow portion, in the present embodiment, a cylindrical shape, and is disposed coaxially with the vacuum container 7. The heat insulating member 8 has the cylindrical shape having a diameter smaller than a diameter of the vacuum container 7, and is disposed inside the vacuum container 7, thereby inhibiting a heat transfer from a space inside the heat insulating member 8 to the vacuum container 7. The heat insulating member 8 is made of, for example, graphite alone or graphite whose surface is coated with a high-melting point metal carbide such as TaC (tantalum carbide) or NbC (niobium carbide), and is hardly subjected to thermal etching.

The heating vessel 9 configures a crucible serving as a reaction vessel, and has a tube shape providing a hollow portion, in the present embodiment, a cylindrical shape. The hollow portion of the heating vessel 9 configures a reaction chamber in which the SiC single crystal 6 is grown on a surface of the seed crystal 5. The heating vessel 9 is made of, for example, graphite alone or graphite whose surface is coated with a high-melting point metal carbide such as TaC or NbC, and is hardly subjected to thermal etching. The heating vessel 9 is disposed so as to surround the pedestal 10. The exhaust gas such as the unreacted gas in the supply gas 3a is guided to the gas exhaust port 4 through a space between an inner peripheral surface of the heating vessel 9 and outer peripheral surfaces of the seed crystal 5 and the pedestal 10. The heating vessel 9 decomposes the SiC raw material gas by the time the supply gas 3a from the gas supply port 2 is led to the seed crystal 5.

Through holes 8a, 9a are provided in upper portions of the heat insulating member 8 and the heating vessel 9, specifically, at positions above the side wall, and the gas exhaust port 4 is fitted into the through holes, whereby the exhaust gas can be exhausted from the inside of the heating vessel 9 to the outside of the vacuum container 7.

The pedestal 10 is a member on which the seed crystal 5 is disposed. The pedestal 10 has a circular shape on one side on which the seed crystal 5 is disposed. The pedestal 10 is disposed such that a central axis of the pedestal 10 is coaxial with a central axis of the heating vessel 9 and a central axis of the shaft 11a of the rotary pulling mechanism 11 described later. The pedestal 10 is made of, for example, graphite alone or graphite whose surface is coated with a high-melting point metal carbide such as TaC or NbC, and is hardly subjected to thermal etching.

The seed crystal 5 is attached to the one surface of the pedestal 10 facing the gas supply port 2, and the SiC single crystal 6 is grown on the surface of the seed crystal 5. The surface of the pedestal 10 to which the seed crystal 5 is attached has a shape corresponding to the shape of the seed crystal 5. In the present embodiment, by forming the pedestal 10 with a cylindrical member having the same diameter as the seed crystal 5, the one surface on which the seed crystal 5 is disposed has a circular shape. Further, the pedestal 10 is connected to the shaft 11a in a surface opposite to the surface on which the seed crystal 5 is disposed, is rotated with the rotation of the shaft 11a, and can be pulled upward of the paper plane while the shaft 11a is pulled up.

The rotary pulling mechanism 11 rotates and pulls up the pedestal 10 through the shaft 11a formed of a pipe member or the like. In the present embodiment, the shaft 11a is formed in a straight line extending up and down, and one end of the shaft 11a is connected to the surface of the pedestal 10 opposite to the surface on which the seed crystal 5 is attached, and the other end of the shaft 11a is connected to a main body of the rotary pulling mechanism 11. The shaft 11a is also made of, for example, graphite alone or graphite whose surface is coated with a high-melting point metal carbide such as TaC or NbC, and is hardly subjected to thermal etching. With the above configuration, the pedestal 10, the seed crystal 5, and the SiC single crystal 6 can be rotated and pulled up, so that a growth plane of the SiC single crystal 6 can have a desired temperature distribution, and a temperature of the growth surface can be adjusted to a temperature suitable for growth along with the growth of the SiC single crystal 6.

Each of the first heating device 12 and the second heating device 13 includes a heating coil such as an induction heating coil and a direct heating coil, and is arranged so as to surround the vacuum container 7 to heat the heating vessel 9. In the present embodiment, each of the first heating device 12 and the second heating device 13 includes an induction heating coil. The first heating device 12 and the second heating device 13 are configured to be capable of independently controlling the temperature of a target location. The first heating device 12 is disposed at a position corresponding to a lower position of the heating vessel 9, and the second heating device 13 is disposed at a position corresponding to the pedestal 10. Therefore, the temperature of the lower portion of the heating vessel 9 can be controlled by the first heating device 12 to heat and decompose the SiC raw material gas. In addition, the temperature around the pedestal 10, the seed crystal 5, and the SiC single crystal 6 can be controlled to a temperature suitable for the growth of the SiC single crystal 6 by the second heating device 13. In the present embodiment, the heating device includes the first heating device 12 and the second heating device 13. However, the heating device may also be configured to include only the first heating device 12.

In this manner, the SiC single crystal manufacturing apparatus 1 according to the present embodiment is configured. Subsequently, a manufacturing method of the SiC single crystal 6 using the SiC single crystal manufacturing apparatus 1 according to the present embodiment will be described.

First, the seed crystal 5 is attached to the one surface of the pedestal 10. The seed crystal 5 is, for example, an off substrate in which the growth surface of the SiC single crystal 6, that is, one surface opposite to the pedestal 10 has a predetermined off-angle, such as 4° or 8°, with respect to a (000-1) C surface.

Subsequently, the pedestal 10 and the seed crystal 5 are disposed in the heating vessel 9. Then, the first heating device 12 and the second heating device 13 are controlled to provide a desired temperature distribution. In other words, the temperature distribution is controlled such that the SiC raw material gas included in the supply gas 3a is heated and decomposed to be supplied to the surface of the seed crystal 5, and the SiC raw material gas is recrystallized on the surface of the seed crystal 5, while a sublimation rate is higher than a recrystallization rate in the heating vessel 9. For example, the temperature distribution can be realized by setting the temperature of the bottom of the heating vessel 9 to 2400° C. and the temperature of the surface of the seed crystal 5 to about 2200° C.

In addition, the supply gas 3a including the SiC raw material gas is introduced through the gas supply port 2 while introducing the carrier gas using an inert gas such as Ar or He and an etching gas such as $H_2$ or HCl as required while the vacuum container 7 is maintained at a desired pressure. As a result, the supply gas 3a flows as indicated by an arrow in FIG. 1 and is supplied to the seed crystal 5, and the SiC single crystal 6 is grown on the surface of the seed crystal 5 based on the gas supply. Further, in the present embodiment, the gas containing the atoms of the heavy metal having the specific gravity higher than the specific gravity of Fe is also included in the supply gas 3a. Therefore, the heavy metal atoms contained in the supply gas 3a are added to the SiC single crystal 6 during growth.

At this time, by adjusting the amount of the gas containing the heavy metal atoms included in the supply gas 3a, the heavy metal element is added to the SiC single crystal 6 at a density of $1\times10^{15}$ cm$^{-3}$ or more, preferably $1\times10^{16}$ cm$^{-3}$ or more. As described above, at least one or more selected from the group consisting of Fe, Nb, Ta, Mo, W, and Ir can be used as the heavy metal. In that case, the total density of a plurality of types of heavy metal elements may be $1\times10^{15}$ cm$^{-3}$ or more and $5.0\times10^{18}$ cm$^{-3}$ or less. The reason for this will be described later.

Then, the rotary pulling mechanism 11 pulls up the pedestal 10, the seed crystal 5 and the SiC single crystal 6 in accordance with the growth rate of the SiC single crystal 6 while rotating them through the shaft 11a. As a result, a height of the growth surface of the SiC single crystal 6 is kept substantially constant, and the temperature distribution of the growth surface temperature can be controlled with high controllability. In addition, since the SiC single crystal 6 is grown in the high-temperature heating vessel 9, the crystal can be prevented from adhering to the surface other than the seed crystal 5, and clogging of the gas exhaust port 4 can be prevented so that the SiC single crystal 6 can continuously grow.

As described above, the heavy metal element is added in the SiC single crystal 6 by introducing the gas containing the heavy metal atoms, which is included in the supply gas 3a. Then, the heavy metal element is added in the SiC single crystal 6 at a density of $1\times10^{15}$ cm$^{-3}$ or more, preferably $1\times10^{16}$ cm$^{-3}$ or more, and $5.0\times10^{18}$ cm$^{-3}$ or less. This reason will be described.

Figure 2:
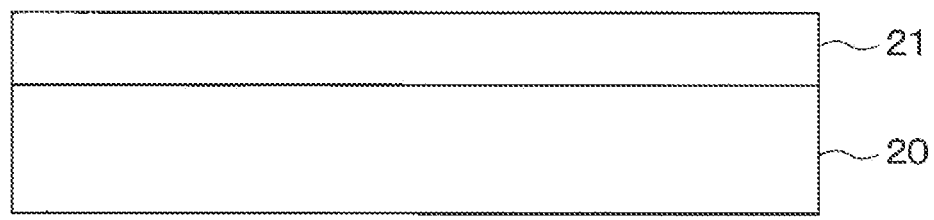
FIG. 2 is a diagram showing a state in which an SiC layer is epitaxially grown on a wafer formed by slicing an SiC single crystal.

Physical properties of the SiC single crystal 6 change when a heavy metal or the like is added, and this changes a yield stress which is a boundary between an elastic deformation region and a plastic deformation region, that is, a proof stress. In an experiment, the inventors investigated the amount of strain when a stress was applied by changing an addition density of the heavy metal element. As a result, even when the same stress was applied, the amount of strain decreased with the increase in addition density of the heavy metal element. It was confirmed that when the addition density is $1\times10^{15}$ cm$^{-3}$ or more, the amount of warpage when the SiC single crystal 6 is formed and then sliced into a wafer shape is 1/10 or less as compared with the case where no heavy metal element is added. The degree of reduction in the amount of warpage differs depending on the heavy metal element to be added, but when any of Nb, Ta, Mo, W, and Ir is used, the amount of warpage was 1/10 or less as compared with the case where no heavy metal element is added. Furthermore, it was found that the yield stress of the SiC crystal to which the heavy metal atoms such as Nb, Ta, Mo, W, and Ir are added is large. This means that plastic deformation is less likely to occur, and further, dislocations are less likely to occur due to thermal stress generated during the growth of the SiC single crystal 6. Further, it means that dislocations are less likely to occur when the SiC single crystal 6 is sliced into a wafer 20 and an SiC layer 21 is formed on the wafer 20 by epitaxial growth as shown in FIG. 2. When such an effect of suppressing dislocations (hereinafter referred to as a dislocation suppressing effect) is obtained, it is possible to suppress the occurrence of dislocations and also suppress propagation of dislocations.

Therefore, the addition density of the heavy metal element in the SiC single crystal 6 is set to $1\times10^{15}$ cm$^{-3}$ or more. In particular, when Nb or Ta is used, the degree of reduction in the amount of warpage is large. Therefore, it is preferable to add Nb or Ta as the heavy metal element to the SiC single crystal 6 because the dislocation suppressing effect can be further enhanced.

In addition, it was confirmed that the amount of strain with respect to the stress decreases with the increase in addition density of the heavy metal element in the SiC single crystal 6, and plastic deformation is less likely to occur when the addition density is $1\times10^{16}$ cm$^{-3}$ or more compared with the case where the addition density is $1\times10^{15}$ cm$^{-3}$. Therefore, the addition density of the heavy metal element in the SiC single crystal 6 is preferably set to $1\times10^{16}$ cm$^{-3}$ or more.

The addition density of the heavy metal element in the SiC single crystal 6 is the same even when two or more heavy metals are used. The dislocation suppressing effect can be obtained when the total density of a plurality of types of heavy metal elements is $1\times10^{15}$ cm$^{-3}$ or more.

However, it was confirmed that when the addition density of the heavy metal element in the SiC single crystal 6 exceeds $5.0\times10^{18}$ cm$^{-3}$, dislocations occur on the contrary. It is considered that this is because the stress due to lattice mismatch, which causes crystal defects such as heterogeneous polymorphs and dislocations, has increased. Therefore, the addition density of the heavy metal element in the SiC single crystal 6 is set to $5.0\times10^{18}$ cm$^{-3}$ or less. The same applies when two or more heavy metals are used, and the total density of a plurality of types of heavy metal elements is set to $5.0\times10^{18}$ cm$^{-3}$ or less.

As described above, in the present embodiment, the heavy metal element is added during the growth of the SiC single crystal 6, and the addition density of the heavy metal element is set to $1\times10^{15}$ cm$^{-3}$ or more. Accordingly, the dislocation suppressing effect in the SiC single crystal 6 can be obtained.

This dislocation suppressing effect is also effective during the growth of the SiC single crystal 6, but is particularly effective when the wafer 20 is manufactured using the SiC single crystal 6 and the SiC layer 21 is formed on the wafer 20 by epitaxial growth. That is, when the SiC single crystal 6 is sliced into a thin disk-shaped wafer 20, the wafer 20 is warped in a state where a residual stress is inherent. The amount of warpage increases with the increase in wafer diameter and with the decrease in wafer thickness. In particular, the warpage becomes remarkable when the wafer diameter is 100 mm or more and the wafer thickness is 10 mm or less. However, as described above, in the wafer 20 according to the present embodiment, the amount of warpage is 1/10 or less as compared with the case where no heavy metal element is added, and the dislocation suppressing effect can be exhibited even when the diameter is large and the wafer thickness is thin.

However, when the wafer thickness is 1 μm or less, the amount of warpage of the wafer 20 is reduced due to the dislocation suppressing effect, but the wafer 20 is easily cracked. Therefore, it is preferable that the wafer thickness is 10 μm or more.

Furthermore, the addition density of the heavy metal element in the SiC single crystal 6 is set to $5.0 \times 10^{18}$ cm$^{-3}$ or less. As a result, lattice mismatch that causes crystal defects such as heterogeneous polymorphisms and dislocations can be suppressed, and dislocations due to excessively high addition density of the heavy metal element can be suppressed.

Further, a seed crystal 5 can be cut out from the SiC single crystal 6 obtained as described above, and the seed crystal 5 can be used to grow the SiC single crystal 6 again by the above-described manufacturing method. As a result, the SiC single crystal 6 having the same quality as described above can be manufactured again.

Second Embodiment

A second embodiment will be described. The present embodiment is different from the first embodiment in that an n-type impurity is added to the SiC single crystal 6, and the other parts are the same as those in the first embodiment. Therefore, only a part different from the first embodiment will be described.

In the manufacturing method of the first embodiment, an impurity for making the SiC single crystal 6 n-type can also be added. For example, when manufacturing an n-type SiC single crystal 6, N (nitrogen), which becomes an n-type impurity, is added at the same time. For example, by including $N_2$ gas or $NH_4$ in the supply gas 3a, N can be added to the SiC single crystal 6. Further, it was confirmed that when the density of N added to the SiC single crystal 6 at the same time as the heavy metal element is set to $1 \times 10^{18}$ cm$^{-3}$ or more, the dislocation suppressing effect due to the addition of the heavy metal can be further enhanced.

In this way, it is possible to add an impurity in addition to the heavy metal element to the SiC single crystal 6, and it is possible to obtain an n-type or p-type SiC single crystal 6. Further, when the density of N added to the SiC single crystal 6 at the same time as the heavy metal element is set to $1 \times 10^{18}$ cm$^{-3}$ or more, the dislocation suppressing effect due to the addition of the heavy metal can be further enhanced.

When the heavy metal element is added to the SiC single crystal 6, the resistance of the SiC single crystal 6 may increase due to factors such as a decrease in the activation rate of the added impurity and a decrease in the carrier concentration. However, according to experiments, it was confirmed that when the ratio of the addition density of N to the addition density of heavy metal element, that is, the addition density of N/the addition density of heavy metal element is 2.0 or more, the activation rate of N is sufficiently secured, and the increase in resistance of the SiC single crystal 6 can be suppressed. Therefore, in order to obtain the desired resistance value of the SiC single crystal 6, the addition density of N/the addition density of the heavy metal element should be 2.0 or more.

Third Embodiment

A third embodiment will be described. The present embodiment is different from the first embodiment and the second embodiment in that a position where the heavy metal element is added is specified, and other parts are the same as those in the first embodiment and the second embodiment. Therefore, only a part different from the first embodiment and the second embodiment will be described.

Figure 3:
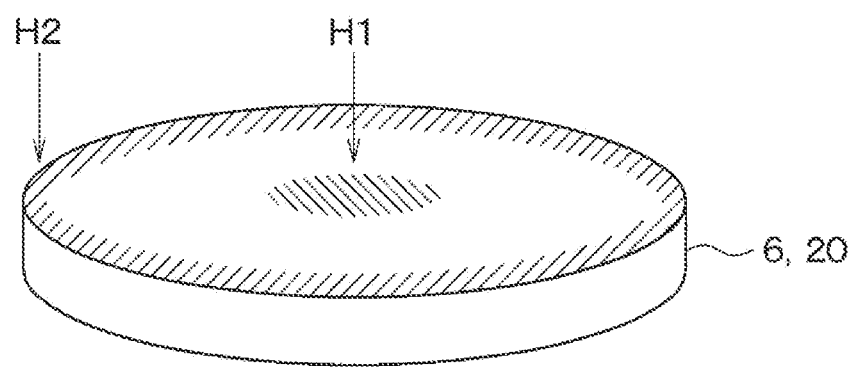
FIG. 3 is a perspective view of a wafer manufactured by slicing an SiC single crystal having a structure in which an addition density of a heavy metal element is different between an outer peripheral portion and a central portion.

As shown in FIG. 3, in the present embodiment, an addition density of the heavy metal element is lower in the central portion H1 and the same in the outer peripheral portion H2 of the SiC single crystal 6 as compared with the addition density of the heavy metal element shown in the first embodiment. That is, in the present embodiment, at least in the outer peripheral portion H2, the addition density of the heavy metal element in the SiC single crystal 6 is $1 \times 10^{15}$ cm$^{-3}$ or more, preferably $1 \times 10^{16}$ cm$^{-3}$ or more, and $5.0 \times 10^{18}$ cm$^{-3}$ or less.

Dislocations generated by stress mainly occur in the outer peripheral portion H2 of the wafer 20. Therefore, in the SiC single crystal 6 and the wafer 20 manufactured by slicing the SiC single crystal 6, it is necessary that the addition density of the heavy metal element in the outer peripheral portion H2 is a density suitable for suppressing the warp, and the density of the central portion H1 may be lower than that. Therefore, in the present embodiment, the outer peripheral portion H2 satisfies the addition density of the heavy metal element described in the first embodiment.

The addition density of the heavy metal element in the central portion H1 referred to here is the density at an arbitrary point within a radius of 10 mm from the center of the SiC single crystal 6. The addition density of the heavy metal element in the outer peripheral portion H2 is the density at an arbitrary point within 10 mm from the outermost circumference of the SiC single crystal 6.

In this way, by making the addition density of the heavy metal element in the outer peripheral portion H2 satisfy the density described in the first embodiment, a warp of the SiC single crystal 6 and a warp of a wafer when the wafer is manufactured using the SiC single crystal 6 can be suppressed. Accordingly, effects similar to the first embodiment can be achieved.

However, considering that lattice mismatch may occur due to the difference in the addition density between the central portion H1 and the outer peripheral portion H2, it is preferable that the difference in the addition density of the heavy metal element between the central portion H1 and the outer peripheral portion H2 is small. According to an experiment, it was confirmed that if the addition density of the heavy metal element in the outer peripheral portion H2 is $C_{H2}$, the addition density of the heavy metal element in the central portion H1 is $C_{H1}$, and these ratios satisfy the relationship of $C_{H2}/C_{H1} \geq 1.2$, it is possible to suppress lattice mismatch due to the difference in addition density. Therefore, although the addition density of the heavy metal element in the central portion H1 may be an arbitrary value, it is preferable to satisfy the relationship of $C_{H2}/C_{H1} \geq 1.2$.

A manufacturing method of the SiC single crystal 6 in which the addition density of the heavy metal element is higher in the outer peripheral portion H2 than in the central portion H1 is basically the same as the manufacturing method according to the first embodiment, but a way to apply the gas containing the heavy metal to the seed crystal 5 is controlled. That is, the SiC single crystal 6 is grown by applying the supply gas 3a including the gas containing the heavy metal to the outer peripheral portion of the seed crystal 5. For example, the supply port 2 is arranged so as to be eccentric with respect to the center of the pedestal 10 and the shaft 11a, and an outlet side of the supply port 2 is brought closer to the seed crystal 5. This makes it possible to grow the SiC single crystal 6 having the configuration as described in the present embodiment.

As described above, even when the addition density of the heavy metal element is high in the outer peripheral portion H2 and the addition density of the heavy metal element is low in the central portion H1, nitrogen can be added to the SiC single crystal 6 as described in the second embodiment. In that case, the addition density of nitrogen/the addition density of the heavy metal element in the outer peripheral portion H2 having the highest addition density of the heavy metal may be 2.0 or more.

Other Embodiments

While the present disclosure has been described in accordance with the embodiments described above, the present disclosure is not limited to the embodiments and includes various modifications and equivalent modifications. Furthermore, various combinations and aspects, and other combination and aspect including only one element, more than one element or less than one element, are also within the sprit and scope of the present disclosure.

(1) For example, in each of the above embodiments, as examples of adding the heavy metal element to the SiC single crystal 6, a case where only the heavy metal element is added and a case where an n-type impurity is added in addition to the heavy metal element has been described. However, these are only examples, and other elements may be added.

However, it was confirmed that addition of light metal elements having a specific gravity lower than the specific gravity of Fe, such as V (vanadium), Ti (titanium), B (boron), Al (aluminum), Cr (chromium), and Mn (manganese), causes the propagation of dislocations. For this reason, it is important to reduce the addition density of light metal elements. In particular, V (vanadium) and Ti (titanium) are light metal elements that have the most adverse effect. According to experiments, it was confirmed that adverse effects can be ignored if the addition densities of V and Ti are set to $5.0 \times 10^{14}$ cm$^{-3}$ or less. Further, B is also a light metal element that has an adverse effect, but the degree of adverse effect is lower than that of V and Ti. According to an experiment, it was confirmed that the adverse effect can be ignored if the addition density of B is set to $5.0 \times 10^{15}$ cm$^{-3}$ or less. A degree of adverse effect by Al is low, but a large amount of Al has an adverse effect. According to an experiment, it was confirmed that the adverse effect can be ignored if the addition density of Al is set to $5.0 \times 10^{17}$ cm$^{-3}$ or less.

A plurality of elements selected from V, Ti, B, and Al may be added to the SiC single crystal 6, but the degree of adverse effect of these light metal elements changes depending on the interaction. Therefore, it is preferable that the individual addition densities are equal to or less than the above-described upper limit values, and the total addition density of all the light metal elements is $5.0 \times 10^{17}$ cm$^{-3}$ or less.

Degrees of adverse effect by Cr and Mn are low, but large amounts of Cr and Mn have adverse effects. According to an experiment, it was confirmed that the adverse effect can be ignored if the addition densities of Cr and Mn are set to $5.0 \times 10^{17}$ cm$^{-3}$ or less.

(2) In the first and second embodiments, the configurations in which the addition density of the heavy metal element in the SiC single crystal 6 is uniform have been described. In the third embodiment, the configuration in which the addition density of the heavy metal element in the SiC single crystal 6 is higher in the outer peripheral portion H2 than in the central portion H1 has been described. However, these configurations are just examples. It is necessary only to add the heavy metal element at a density of $1 \times 10^{15}$ cm$^{-3}$ or more, preferably $1 \times 10^{16}$ cm$^{-3}$ or more, and $5.0 \times 10^{18}$ cm$^{-3}$ or less at least in the outer peripheral portion H2 of the SiC single crystal 6. That is, it is not necessary that the addition density of the heavy metal element is uniform over the entire area of the SiC single crystal 6.

In order to obtain the desired resistance value of the SiC single crystal 6, it is preferable that the addition density of N/the addition density of the heavy metal element is set to 2.0 or more at a position where the addition density of the heavy metal element is the highest in the SiC single crystal 6.

(3) Further, in each of the above embodiments, the case where the SiC single crystal 6 is grown by the gas growth method has been described as an example of a bulk crystal growth method. However, this is also only an example, and since it is sufficient to add the heavy metal element to the SiC single crystal 6, other manufacturing methods such as a sublimation growth method and a solution method may also be used.

Further, as for the method of supplying the gas containing the heavy metal, it is not necessary to include the gas containing the heavy metal in the supply gas 3a as in the first to third embodiments, but the gas containing the heavy metal may be separately supplied from a different place. Further, the gas containing the heavy metal does not necessarily have to be in a gas state from the beginning. For example, a solid heavy metal may be installed in the heating vessel 9, and the heavy metal may be evaporated by heating to become a gas state, and the heavy metal in the gas state may be supplied to the SiC single crystal 6.

(4) Further, the SiC single crystal manufacturing apparatus 1 can be changed as appropriate. For example, although the rotary pulling mechanism 11 capable of both rotating and pulling up the pedestal 10 has been exemplified, a rotation mechanism capable of at least rotating the pedestal 10 may be used. Further, although the SiC single crystal manufacturing apparatus 1 is configured so that the supply gas 3a including the gas containing the heavy metal as well as the SiC raw material gas can be introduced from the gas supply source 3, it is not necessary to supply each gas from the same gas supply source 3 and the same supply port 2.

What is claimed is:

1. A silicon carbide single crystal comprising:
a heavy metal element having a specific gravity higher than a specific gravity of iron; and
a light metal element including boron, wherein
an addition density of the heavy metal element at least in an outer peripheral portion of the silicon carbide single crystal is $1 \times 10^{15}$ cm$^{-3}$ or more, and
an addition density of the boron is $5.0 \times 10^{15}$ cm$^{-3}$ or less.

2. The silicon carbide single crystal according to claim 1, wherein
the addition density of the heavy metal element is $1 \times 10^{16}$ cm$^{-3}$ or more.

3. The silicon carbide single crystal according to claim 1, wherein
the addition density of the heavy metal element is $5.0 \times 10^{18}$ cm$^{-3}$ or less.

4. The silicon carbide single crystal according to claim 1, wherein
the heavy metal element is tantalum or niobium.

5. The silicon carbide single crystal according to claim 1, further comprising nitrogen, wherein an addition density of the nitrogen is $1\times10^{18}$ cm$^{-3}$ or more.

6. The silicon carbide single crystal according to claim 5, wherein
at a position where the addition density of the heavy metal element is highest, a ratio of the addition density of nitrogen to the addition density of the heavy metal element is 2.0 or more.

7. A silicon carbide single crystal comprising:
a heavy metal element having a specific gravity higher than a specific gravity of iron; and
a light metal element including aluminum, wherein
an addition density of the heavy metal element at least in an outer peripheral portion of the silicon carbide single crystal is $1\times10^{15}$ cm$^{-3}$ or more, and an addition density of the aluminum is $5.0\times10^{17}$ cm$^{-3}$ or less.

8. The silicon carbide single crystal according to claim 7, wherein
the addition density of the heavy metal element is $1\times10^{16}$ cm$^{-3}$ or more.

9. The silicon carbide single crystal according to claim 7, wherein
the addition density of the heavy metal element is $5.0\times10^{18}$ cm$^{-3}$ or less.

10. The silicon carbide single crystal according to claim 7, wherein
the heavy metal element is tantalum or niobium.

11. The silicon carbide single crystal according to claim 7, further comprising nitrogen, wherein
an addition density of the nitrogen is $1\times10^{18}$ cm$^{-3}$ or more.

12. The silicon carbide single crystal according to claim 11, wherein
at a position where the addition density of the heavy metal element is highest, a ratio of the addition density of nitrogen to the addition density of the heavy metal element is 2.0 or more.

* * * * *